(12) United States Patent
Togami et al.

(10) Patent No.: US 12,119,279 B2
(45) Date of Patent: Oct. 15, 2024

(54) SEMICONDUCTOR DEVICE HAVING AT LEAST ONE RESIN PART THAT CLOSES ONE OR MORE CORRESPONDING ONES OF A PLURALITY OF THREADED HOLES

(71) Applicant: Mitsubishi Electric Corporation, Tokyo (JP)

(72) Inventors: Mamoru Togami, Tokyo (JP); Toshitaka Sekine, Tokyo (JP); Teruaki Nagahara, Tokyo (JP); Hiroyuki Nakamura, Tokyo (JP); Kazuhiro Kawahara, Tokyo (JP); Kosuke Yamaguchi, Tokyo (JP); Shota O, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 17/471,688

(22) Filed: Sep. 10, 2021

(65) Prior Publication Data

US 2022/0148937 A1 May 12, 2022

(30) Foreign Application Priority Data

Nov. 12, 2020 (JP) ................. 2020-188457

(51) Int. Cl.
| | |
|---|---|
| *H01L 23/31* | (2006.01) |
| *H01L 23/40* | (2006.01) |
| *F16B 37/14* | (2006.01) |
| *F16B 41/00* | (2006.01) |
| *H01L 23/32* | (2006.01) |
| *H01L 23/495* | (2006.01) |

(52) U.S. Cl.
CPC ...... *H01L 23/3121* (2013.01); *H01L 23/4006* (2013.01); *F16B 37/14* (2013.01); *F16B 41/005* (2013.01); *H01L 23/32* (2013.01); *H01L 23/49555* (2013.01)

(58) Field of Classification Search
CPC ............ H01L 23/4006; H01L 23/3121; H01L 23/49555; H01L 23/3107; F16B 37/14; F16B 41/005
USPC ................. 257/675, 712, E21.502, E21.504; 411/372.5, 431
See application file for complete search history.

(56) References Cited

U.S. PATENT DOCUMENTS

| | | | | |
|---|---|---|---|---|
| 3,557,654 | A * | 1/1971 | Weidner, Jr. .......... | F16B 33/004 411/378 |
| 4,861,251 | A * | 8/1989 | Moitzger ................ | B29C 33/18 425/572 |
| 5,997,229 | A * | 12/1999 | Akers ..................... | F16B 37/14 411/372.5 |

(Continued)

FOREIGN PATENT DOCUMENTS

JP S63-055546 U 4/1988

*Primary Examiner* — David Chen
(74) *Attorney, Agent, or Firm* — Studebaker & Brackett PC

(57) ABSTRACT

A semiconductor device includes: a package to seal a semiconductor element; a lead frame having one end portion connected to the semiconductor element and the other end portion protruding from a side surface of the package; a plurality of threaded holes formed in the package to enable the package to be fixed to the substrate; and a resin part capable of closing each of the plurality of threaded holes. A type name of the semiconductor device is represented by open and closed states of the respective threaded holes.

8 Claims, 2 Drawing Sheets

(56) References Cited

U.S. PATENT DOCUMENTS

| | | | | |
|---|---|---|---|---|
| 2005/0161782 A1* | 7/2005 | Kanakubo | .............. | H05K 3/284 |
| | | | | 257/E23.047 |
| 2012/0241968 A1* | 9/2012 | Camacho | ................ | H01L 24/97 |
| | | | | 257/E21.705 |
| 2013/0334672 A1* | 12/2013 | Denta | ................... | H01L 23/495 |
| | | | | 438/123 |
| 2020/0091025 A1* | 3/2020 | Ichimura | ................ | H01L 21/52 |

* cited by examiner

SEMICONDUCTOR DEVICE HAVING AT LEAST ONE RESIN PART THAT CLOSES ONE OR MORE CORRESPONDING ONES OF A PLURALITY OF THREADED HOLES

BACKGROUND OF THE INVENTION

Field of the Invention

The present disclosure relates to semiconductor devices.

Description of the Background Art

There is technology of forming a plurality of holes in a package of a conventional semiconductor device, closing upper end portions of the holes with thin resin parts, breaking the thin resin parts in accordance with results of an electrical property test, and displaying ranks of the results of the electrical property test using open and closed states of the respective holes (see Japanese Utility Model Application Laid-Open No. 63-55546, for example).

In technology disclosed in Japanese Utility Model Application Laid-Open No. 63-55546, however, a type name of a product cannot be identified using the open and closed states of the respective holes. This causes a problem in that another type of semiconductor device might be erroneously mounted to a substrate when the semiconductor device has the same ranks of the results of the electrical property test even if the semiconductor device has a different type name.

SUMMARY

It is an object of the present disclosure to provide a semiconductor device facilitating identification of a type name of a product and being capable of suppressing erroneous mounting to a substrate.

A semiconductor device according to the present disclosure is a semiconductor device to be mounted to a substrate. The semiconductor device includes a package, a lead frame, a plurality of threaded holes, and a resin part. The package seals a semiconductor element. The lead frame has one end portion connected to the semiconductor element and the other end portion protruding from a side surface of the package. The plurality of threaded holes are formed in the package to enable the package to be fixed to the substrate. The resin part is capable of closing each of the plurality of threaded holes. A type name of the semiconductor device is represented by open and closed states of the respective threaded holes.

A type name of a product can easily be identified using the open and closed states of the respective threaded holes formed in the package, so that erroneous mounting of the semiconductor device to the substrate can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
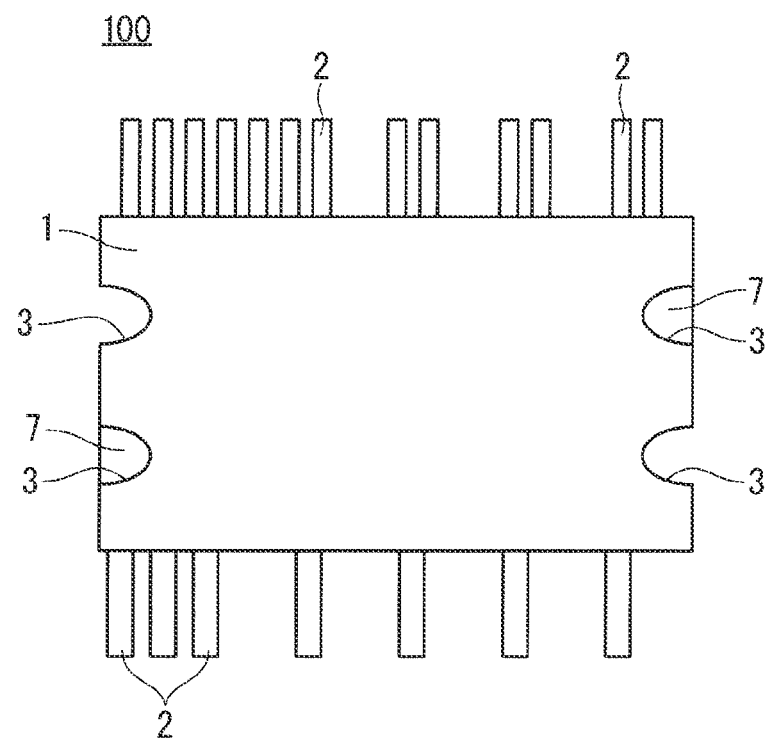
FIG. 1 is a plan view of a semiconductor device according to Embodiment 1.
Figure 2:
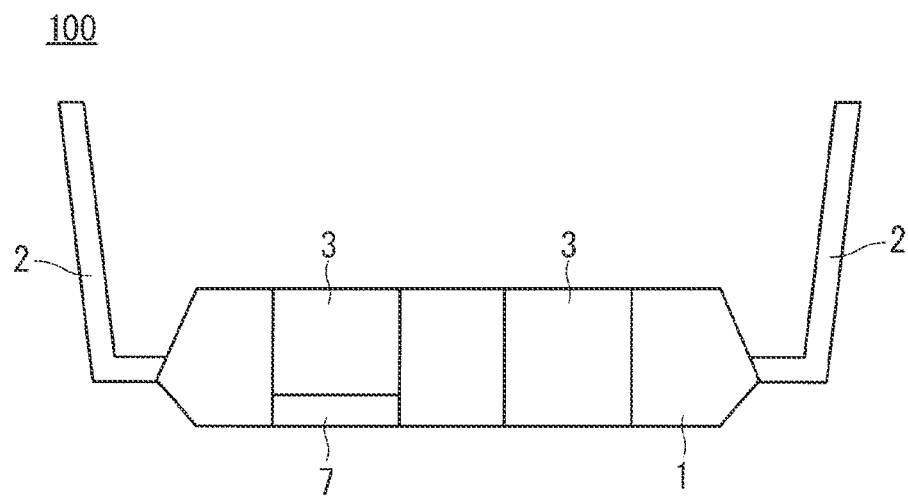
FIG. 2 is an elevation view of the semiconductor device according to Embodiment 1 in an upside down position.

Embodiment 1 will be described below with reference to drawings. FIG. 1 is a plan view of a semiconductor device 100 according to Embodiment 1. FIG. 2 is an elevation view of the semiconductor device 100 in an upside down position.

As illustrated in FIG. 1, the semiconductor device 100 includes a package 1, a plurality of lead frames 2, a plurality of threaded holes 3, and at least one resin part 7.

The package 1 is rectangular in plan view, and seals a semiconductor element (not illustrated) and an internal circuit (not illustrated). The package 1 is formed of a thermosetting resin, such as an epoxy resin. The plurality of lead frames 2 each have one end portion connected to the semiconductor element in the package 1. The plurality of lead frames 2 each have the other end portion protruding from a side surface of the package 1, and connected to an external circuit (not illustrated).

The plurality of threaded holes 3 are through holes through which screws (not illustrated) are insertable to fix the package 1 to a substrate (not illustrated) when the semiconductor device 100 is mounted to the substrate. The plurality of threaded holes 3 are formed at front and rear end portions of the package 1. Specifically, the plurality of threaded holes 3 have been recessed inward from the front and rear ends of the package 1. Although four threaded holes 3 are illustrated in FIG. 1, the number of threaded holes 3 is not limited to four, and is only required to be two or more.

The resin part 7 is formed to have the same size as each of the threaded holes 3 in plan view so that the resin part 7 can close the threaded hole 3. The resin part 7 is formed of a thermosetting resin, such as an epoxy resin. The resin part 7 is provided in each of the threaded holes 3 to close the threaded hole 3. A type name of the semiconductor device 100 as a product is represented by open and closed states of the respective threaded holes 3. Specifically, the type name of the semiconductor device 100 is set by a combination of the open and closed states of the respective threaded holes 3. That is to say, the combination of the open and closed states of the respective threaded holes 3 varies with the type name of the semiconductor device 100. The resin part 7 is provided in each of the threaded holes 3 formed in the package 1 in advance. By removing the resin part 7 provided in each of particular one or more threaded holes 3 in accordance with the type name of the semiconductor device 100 in a post process, the combination of the open and closed states of the respective threaded holes 3 is provided.

The substrate has threaded holes corresponding to the threaded holes 3 of the semiconductor device 100 at a location where the semiconductor device 100 is mounted. The threaded holes of the substrate are formed at locations corresponding to locations of threaded holes 3 in an open state of the semiconductor device 100.

When a semiconductor device 100 having a type name matching a type name of a semiconductor device 100 to be mounted to the substrate is disposed on the substrate, the threaded holes of the substrate and the threaded holes 3 in the open state of the semiconductor device 100 match each other, so that the semiconductor device 100 can threadably be mounted to the substrate. On the other hand, if another type of semiconductor device 100 is erroneously disposed on the substrate, the threaded holes of the substrate and the threaded holes 3 in the open state of the semiconductor device 100 do not match each other, so that the semiconductor device 100 cannot threadably be mounted to the substrate. Erroneous mounting of the semiconductor device 100 to the substrate can thereby be suppressed.

As illustrated in FIG. 2, the resin part 7 is thinner than the package 1, and is formed at an upper end portion of each of the threaded holes 3. Specifically, the resin part 7 has a thickness capable of being perforated with a simple tool, such as cutting pliers, and has a thickness of 2 mm or less. The resin part 7 more preferably has a thickness of 1 mm or less, and still more preferably has a thickness of 0.5 mm or less.

As described above, the semiconductor device 100 according to Embodiment 1 includes the package 1 to seal the semiconductor element, the lead frames 2 each having one end portion connected to the semiconductor element and the other end portion protruding from the side surface of the package 1, the plurality of threaded holes 3 formed in the package 1 to enable the package 1 to be fixed to the substrate, and the resin part 7 capable of closing each of the plurality of threaded holes 3, and the type name of the semiconductor device 100 is represented by the open and closed states of the respective threaded holes 3.

The type name of the semiconductor device 100 can easily be identified using the open and closed states of the respective threaded holes 3 formed in the package 1, so that erroneous mounting of the semiconductor device 100 to the substrate can be suppressed.

Since the type name of the semiconductor device 100 can be identified using the threaded holes 3 to be used when the semiconductor device 100 is fixed to the substrate, there is no need to separately make a hole, so that an increase in manufacturing cost of the semiconductor device 100 can be suppressed.

Since the resin part 7 is thinner than the package 1, the resin part 7 can easily be perforated with the simple tool, such as the cutting pliers, when the resin part 7 provided in each of the particular one or more threaded holes 3 is removed in accordance with the type name of the semiconductor device 100 in the post process. Production efficiency of the semiconductor device 100 can thereby be improved.

Embodiment 2

Figure 3:
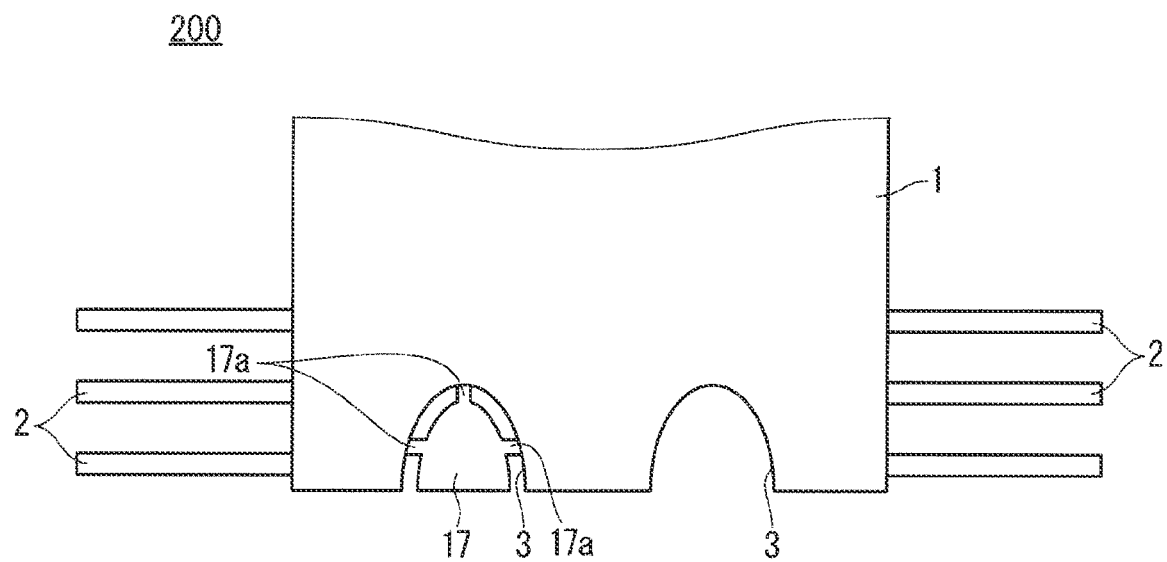
FIG. 3 is an enlarged plan view around threaded holes of a package of a semiconductor device according to Embodiment 2.

A semiconductor device 200 according to Embodiment 2 will be described next. FIG. 3 is an enlarged plan view around the threaded holes 3 of the package 1 of the semiconductor device 200 according to Embodiment 2. In Embodiment 2, the same components as those described in Embodiment 1 bear the same reference signs as those of the components described in Embodiment 1, and description thereof will be omitted.

As illustrated in FIG. 3, the semiconductor device 200 includes the package 1, the plurality of lead frames 2, the plurality of threaded holes 3, and at least one resin part 17 in Embodiment 2.

The resin part 17 is formed to have substantially the same size as each of the threaded holes 3 in plan view so that the resin part 17 can close the threaded hole 3. The resin part 17 is formed of a thermosetting resin, such as an epoxy resin.

The resin part 17 is thinner than the package 1, and is formed at an upper end portion of each of the threaded holes 3. The resin part 17 is connected to the threaded hole 3, for example, via three connections 17a formed of a thermosetting resin, such as an epoxy resin. The connections 17a are each narrower than the resin part 17 in plan view, and thus can be cut with a simple tool, such as diagonal pliers. The number of connections 17a is not limited to three, and is only required to be one or more.

As described above, in the semiconductor device 200 according to Embodiment 2, the resin part 17 is connected to the threaded hole 3 via the connections 17a, and thus can be removed and perforated by cutting the connections 17a with the simple tool, such as the diagonal pliers. Production efficiency of the semiconductor device 200 can thereby be improved.

Ease of removal of the resin part 17 is unaffected by the thickness of the resin part 17, so that durability of the resin part 17 is improved, and unintended perforation of the threaded hole 3 caused by a fall or a shock can be suppressed by increasing the thickness of the resin part 17 compared with that in Embodiment 1.

Embodiment 3

Figure 4:
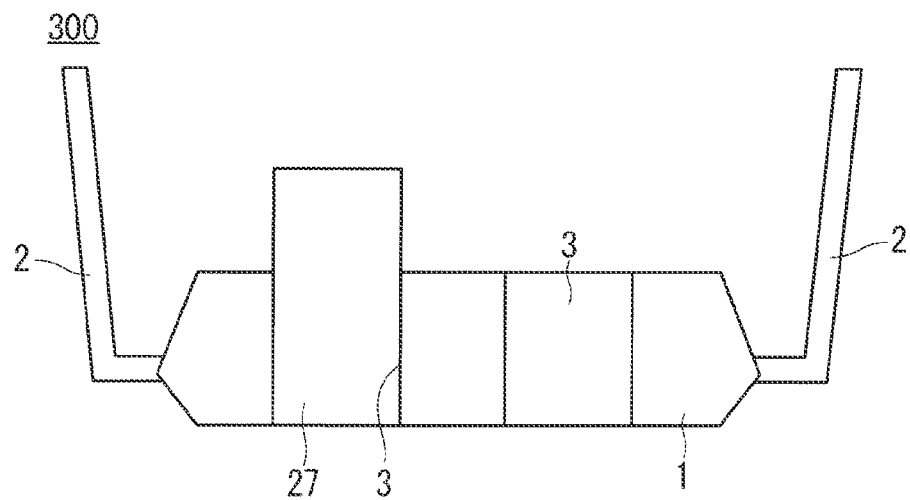
FIG. 4 is an elevation view of a semiconductor device according to Embodiment 3 in an upside down position.

A semiconductor device 300 according to Embodiment 3 will be described next. FIG. 4 is an elevation view of the semiconductor device 300 according to Embodiment 3 in an upside down position. In Embodiment 3, the same components as those described in Embodiments 1 and 2 bear the same reference signs as those of the components described in Embodiments 1 and 2, and description thereof will be omitted.

As illustrated in FIG. 4, the semiconductor device 300 includes the package 1, the plurality of lead frames 2, the plurality of threaded holes 3, and at least one resin part 27 in Embodiment 3.

The resin part 27 is formed to have the same size as each of the threaded holes 3 in plan view so that the resin part 27 can close the threaded hole 3. The resin part 27 is formed of a thermosetting resin, such as an epoxy resin.

The resin part 27 is provided in the threaded hole 3 as a whole, and closes the threaded hole 3 in a state of protruding downward from the threaded hole 3. The resin part 27 protrudes to a height location at which the resin part 27 can be in contact with an upper surface of the substrate when the semiconductor device 300 is mounted to the substrate. It is thus necessary to provide the substrate with a recess (not illustrated) or a hole (not illustrated) into which the resin part 27 is insertable at a location corresponding to the location of the resin part 27.

When a semiconductor device 300 having a type name matching a type name of a semiconductor device 300 to be mounted to the substrate is to be disposed on the substrate, the recess or the hole of the substrate and the resin part 27 of the semiconductor device 300 match each other, so that the semiconductor device 300 can be disposed on the substrate by inserting the resin part 27 into the recess or the hole. On the other hand, if another type of semiconductor device 300 is to be erroneously disposed on the substrate, the recess or the hole of the substrate and the resin part 27 of the semiconductor device 300 do not match each other, so that the semiconductor device 300 cannot be disposed on the substrate. Erroneous mounting of the semiconductor device 300 to the substrate can thereby be suppressed.

A portion of the resin part 27 protruding from a lower surface of the package 1 is herein only required to have a length of 1 mm or more. The portion more preferably has a length of 3 mm or more, and still more preferably has a length of 5 mm or more.

As described above, in the semiconductor device 300 according to Embodiment 3, the resin part 27 protrudes downward from the threaded hole 3. Even if another type of semiconductor device is to be disposed on the substrate, the semiconductor device cannot be disposed on the substrate because a lower end of the resin part 27 is in contact with the upper surface of the substrate. Erroneous mounting of the semiconductor device 300 to the substrate can further be suppressed by combining this function with a function of identifying the type name of the semiconductor device 100 using the open and closed states of the respective threaded holes 3.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device to be mounted to a substrate, the semiconductor device comprising:
    a package to seal a semiconductor element;
    a lead frame having one end portion connected to the semiconductor element and an other end portion protruding from a side surface of the package;
    a plurality of threaded holes formed in the package to enable the package to be fixed to the substrate; and
    at least one resin part that closes one or more corresponding ones of the threaded holes, at least one of the threaded holes being in an open state, the closed one or more corresponding ones of the threaded holes being visible from outside the package, where a lowest surface of the at least one resin part is offset from a lowest surface of the package.

2. The semiconductor device according to claim 1, wherein
    the at least one resin part is thinner than the package.

3. The semiconductor device according to claim 2, wherein
    the at least one resin part is connected to each of the one or more corresponding ones of the threaded holes via a connection.

4. The semiconductor device according to claim 1, wherein
    the at least one resin part protrudes downward from each of the one or more corresponding ones of the threaded holes.

5. The semiconductor device according to claim 1, wherein
    a type name of the semiconductor device is represented by open and closed states of the threaded holes.

6. The semiconductor device according to claim 1, wherein
    the at least one resin part closes the one or more corresponding ones of the threaded holes so as to block a screw from passing through the one or more corresponding ones of the threaded holes.

7. The semiconductor device according to claim 1, wherein
    the at least one resin part is positioned within the one or more corresponding ones of the threaded holes, and
    each of the threaded holes includes a structure having a common shape.

8. The semiconductor device according to claim 1, wherein
    the lowest surface of the at least one resin part is visible from outside the package.

* * * * *